United States Patent [19]

Swann et al.

[11] Patent Number: 4,703,181
[45] Date of Patent: Oct. 27, 1987

[54] ANTI-DRIFT DEVICE FOR SIDE ENTRY ELECTRON MICROSCOPE SPECIMEN HOLDERS

[75] Inventors: Peter R. Swann, Diablo, Calif.; Bernd Kraus, Munich, Fed. Rep. of Germany

[73] Assignee: Gatan Inc., Pleasanton, Calif.

[21] Appl. No.: 848,970

[22] Filed: Apr. 7, 1986

[51] Int. Cl.$^4$ ............................................. H01J 37/20
[52] U.S. Cl. ............................... 250/442.1; 250/443.1
[58] Field of Search ............... 250/442.1, 443.1, 440.1; 219/121 EX

[56] References Cited

U.S. PATENT DOCUMENTS 3,896,314  7/1975  Nukui et al. ..................... 250/442.1
4,591,722  5/1986  Biddlecombe et al. .......... 250/443.1

Primary Examiner—Craig E. Church
Assistant Examiner—Jack I. Berman

[57] ABSTRACT

A device interposed between an electron microscope specimen holder and a microscope translation stage constructed of a special combination of materials arranged in such a manner that little or no specimen drift occurs when the temperature of the complete assembly is changed. In the first and more common arrangement, the device is placed in the nose of the standard microscope specimen holder and consists of a silica rod inside a metal tube, the material of the tube having a larger coefficient of thermal expansion than the material of the specimen rod. In the second, and less common arrangement the device is placed on the opposite side of the specimen away from the nose of the holder and consists of one tube, the material of which must have a larger coefficient of thermal expansion than the material of the specimen holder.

8 Claims, 3 Drawing Figures

ANTI-DRIFT DEVICE FOR SIDE ENTRY ELECTRON MICROSCOPE SPECIMEN HOLDERS

BACKGROUND OF THE INVENTION

1. Field of the Invention

The invention relates to the side entry, rod type of specimen holder commonly used in high resolution electron microscopes and more particularly to the drift in the image of the specimen that occurs when, for various reasons, the temperature of such a holder is different from that of the microscope.

2. Description of Prior Art

Modern electron microscopes are capable of resolving the spacing between atoms providing the drift rate of the specimen is less than about 0.1 nm. A widely used type of electron microscope specimen holder consists of a rod which is inserted through a side entry airlock and placed against a specimen translation stage situated in the center of the microscope objective lens. The device is often described as a rod type, side entry specimen holder. Typically, when the specimen rod is installed after specimen loading its temperature is different from that of the microscope and there is a long period of time during which thermal expansion or contraction cause movements of the specimen which exceed the microscope resolution. These movements appear as drift in the image of the specimen and prevent the full resolution capabilities of the microscope from being realized. Even greater amounts of specimen drift can occur in special forms of side entry holders used for heating and cooling specimens in the electron microscope. In these holders the drift is particularly toublesome because it remains relatively high even after long periods of observation.

A device for reducing thermal drift in the electron microscope was described in an article entitled "Side Entry Specimen Stages" by P. R. Swann in *Kristal und Tecknik* 14, 10, 1979 pp. 1235–1243, herein incorporated by reference. It consists of an electronically controlled piezoelectric crystal coupled to the normal specimen translation stage of the electron microscope to produce a synthetic stage drift which exactly compensates the natural thermally induced specimen drift. This device, although elegant in concept, is complicated to operate.

A second and simpler device is to be found in the side entry, electron microscope specimen holders manufactured by Gatan Incorporated. It consists of a vitreous silica rod embedded in the nose of the specimen holder and spanning most of the distance between the center of the specimen and the specimen translation stage. Since vitreous silica has a very small coefficient of thermal expansion the specimen drift caused by temperature changes in the specimen holder is considerably reduced. Unfortunately, the vitreous silica cannot be used to span the entire distance affected by thermal expansion because being a brittle insulator it is not a suitable material to support the specimen itself. There is, therefore, a residual amount of specimen drift which cannot be eliminated by this device. Furthermore, the silica rod used in the Gatan Incorporated specimen holders is glued into the specimen holder and since it is not freely suspended some of its effectiveness in reducing expansion or contraction is lost.

SUMMARY OF THE INVENTION

The present invention solves the prior art problems of image drift associated with the use of side entry specimen holders in electron microscopes by providing a simple, passive device which almost completely compensates the effect of temperature changes on the position of a specimen. The device has two forms depending on which side of the specimen it is attached to the specimen holder. There is also a third form of the device which can be used when the specimen holder is likely to experience rough handling, as for example, in a cryo-transfer type of application.

Form 1

In this form, the device is inserted directly into the nose of the specimen holder and consists of a tube containing a close fitting rod which is clamped by the tube at one end and protrudes from it at the other. Although close-fitting with the tube, the rod is free to slide within it under the influence of expansion and contraction. The assembly of the tube and rod is pressed into the nose of the specimen holder against a definite stop, (STOP 1), beyond which the assembly is free to move under the influence of thermal expansion and contraction. The device also rests against a second defined stop, (STOP 2), which is the point of contact between the protruding end of the rod and the electron microscope specimen translation stage.

The lengths and materials chosen for the tube and the rod are such that a change in length of the assembly caused by thermal expansion (or contraction) between STOP 1 and STOP 2 is equal in magnitude but opposite in direction to a change in length caused by a similar thermal change in the material connecting STOP 1 to the specimen.

Form 2

In this form, the device is attached to the side entry specimen holder on the side of the specimen that is opposite the nose of the holder. The device consists of a metal tube pressed on to the specimen rod and extending toward the specimen to a support point on the translation stage. The material and length of the tube are chosen so that there is no net motion of the specimen when the assembly experiences a temperature change.

In order to specify the materials and dimensions of the device in either of forms 1 and 2 it is necessary to know the distance between the specimen and the translation stage in the model of electron microscope in which the device is installed.

Form 3

In this form, the device consists of a rod of material having a small coefficient of thermal expansion inserted into the nose of the specimen holder and spanning as much as possible of the distance between the specimen and the specimen rod support point on the translation stage. The rod is clamped to the specimen holder by a spring which permits sliding along the rod axis while preventing movement perpendicular to it.

DESCRIPTION OF THE DRAWINGS

For a better understanding of the present invention, reference may be had to the following detailed description taken with the accompanying drawings in which.

DETAILED DESCRIPTION OF THE PREFERRED EMBODIMENT

Figure 1:
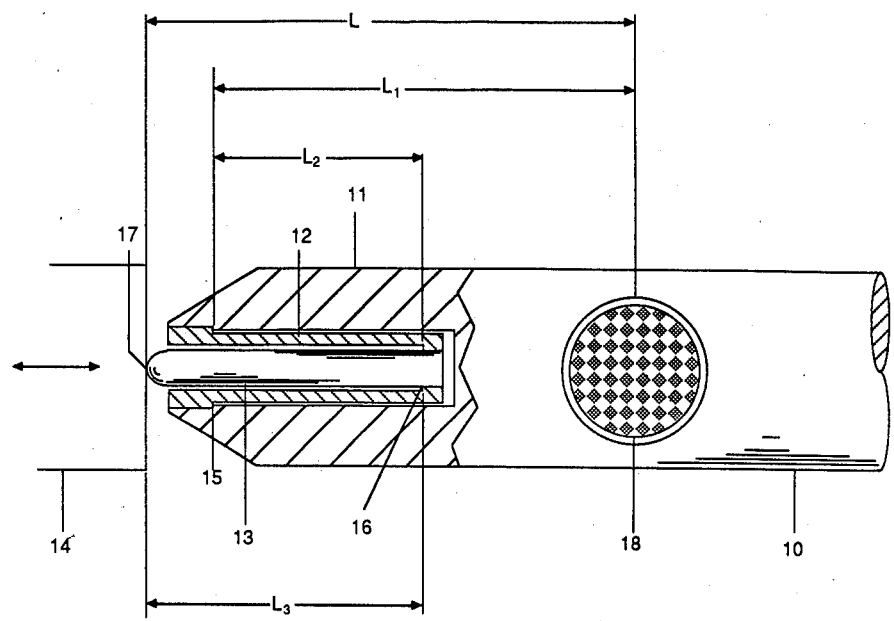
FIG. 1 is a section of the parts composing Form 1 of the device in which the support point of the specimen rod lies on the side of the specimen nearer the nose of the rod.

Referring now to the drawings, there is shown the specimen rod 10 in FIG. 1 with its nose 11 resting against the specimen translation stage 14, only part of which is shown. One practical form of the invention (Form 1) consists of two parts, these being the tube 12 and the rod 13. The tube is firmly attached to the nose of the specimen holder against the stop 15 there being enough clearance between the outside of the tube and the nose of the specimen holder for the tube to expand or contract freely over the distance between the stop 15 and the other end of the tube at 16. The rod is firmly attached to the stop 16 and although close fitting with the tube is able to slide freely within it over the distance between stop 16 and its support point against the specimen translation stage at 17.

Consider now the effect of changing the temperature of parts 11, 12, and 13 connecting the specimen translation stage to the specimen 18. Part 11 expands or contracts in proportion to the product of its expansion coefficient $C_1$ and its length $L_1$ which is the distance between the specimen and stop 15. Part 12 expands or contracts in proportion to the product of its expansion coefficient $C_2$ and its length $L_2$ which is the distance between stops 15 and 16. The rod, part 13, expands or contracts in proportion to the product of its expansion coefficient $C_3$ and its length $L_3$ which is the distance between stops 16 and 17. The essential feature of this form of the invention is that the lengths and expansion coefficients of parts 11, 12, and 13 are chosen so that the net expansion or contraction of the assembly under the influence of a given temperature change is zero. This condition is satisfied if:

$$C_2L_2 = C_1L_1 + C_3L_3$$

The following geometrical constraint must also be satisfied:

$$L = L_1 + L_3 - L_2$$

where, $L$, is the distance between the translation stage (point 17) and the specimen (point 18).

The preferred arrangement in Form 1 of the invention is to use copper as the material of the specimen holder (part 11), aluminum or an aluminum alloy as the material of the tube (part 12) and vitreous silica as the material of the rod (part 13). Copper is preferred for part 11 because it has a high thermal conductivity thus helping the device to follow closely the temperature of the specimen holder. A further consideration is that the specimen support grids used by electron microscopists are mostly made of copper and consequently any expansion or contraction occurring in the support grid (no matter where it is clamped in the specimen recess) will be compensated exactly by an equal and opposite expansion or contraction in the copper specimen holder. Aluminum or an aluminum alloy is preferred for part 12 because it has a larger thermal expansion coefficient than copper (as required by the above specified condition) and also has a high thermal conductivity which helps to maintain its temperature close to that of the specimen holder. Vitreous silica is preferred for part 13 because it has an almost zero coefficient of expansion thereby making its thermal response less important. It also has a low thermal conductivity which helps minimize the thermally induced dimensional changes in the translation stage which are not corrected by this invention.

Figure 2:
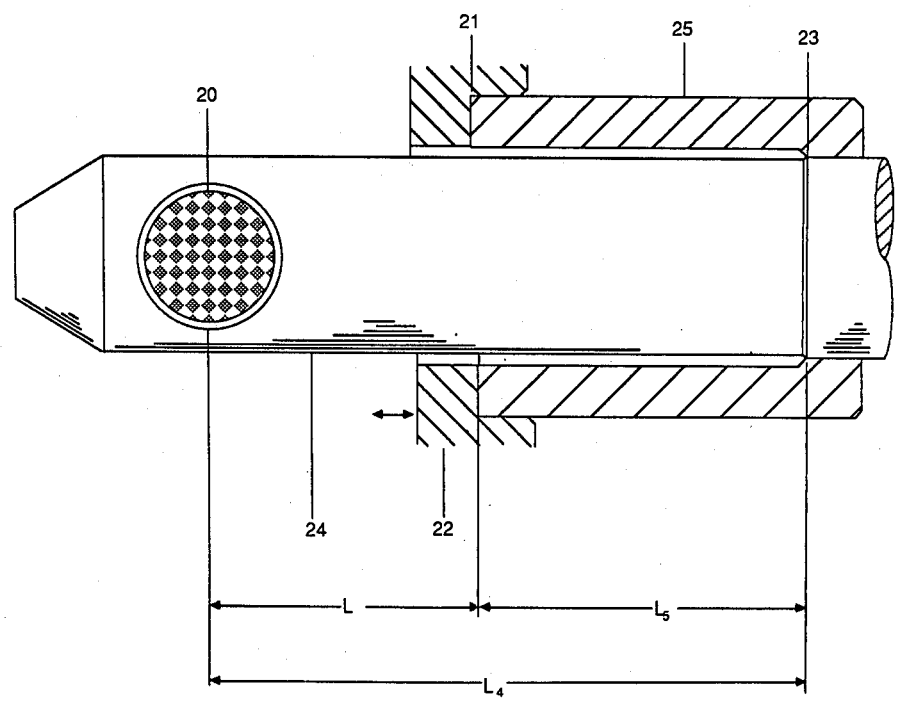
FIG. 2 is a section of the parts composing Form 2 of the device in which the support point of the specimen rod lies on the side of the specimen away from the nose of the rod.

Referring again to the drawings, FIG. 2 shows a second practical form of the device (Form 2) consisting of a single metal tube 25 pressed on to a side entry electron microscope specimen holder 24 at the stop 23 and extending toward the specimen to rest against stop 21 in the specimen translation stage 22 (only part of which is shown in the drawing).

Consider now the effect of changing the temperature of parts 24 and 25 connecting the specimen translation stage to the specimen 20. Part 24 expands or contracts in proportion to the product of its expansion coefficient $C_4$ and its length $L_4$ which is the distance between the specimen and stop 23. Part 25 expands or contracts in proportion to the product of its expansion coefficient $C_5$ and its length $L_5$ which is the distance between the specimen translation stag and the stop 23. The essential feature of this form of the invention is that the lengths and expansion coefficients of parts 24 and 25 are chosen so that the net expansion or contraction of the assembly under the influence of a given temperature change is zero. This condition is satisfied if:

$$C_4L_4 = C_5L_5$$

Again, there is the geometrical constraint that $$L = L_4 - L_5$$

where $L$ is the distance between the center of the specimen 20 and the translation stage stop 21. The preferred arrangement in Form 2 of the invention is to use copper as the material of the specimen holder (part 24) and aluminum or an aluminum alloy as the material of the tube 25.

The connecting members 12 and 25 in Forms 1 and 2 of the invention do not necessarily have to be tubular. Other shapes work equally well provided the mechanical linkage is strong enough and the thermal expansion characteristics satisfy the conditions described. However, because side entry specimen holders are generally rod shaped the tubular design of members 12 and 25 will be convenient for most applications.

Figure 3:
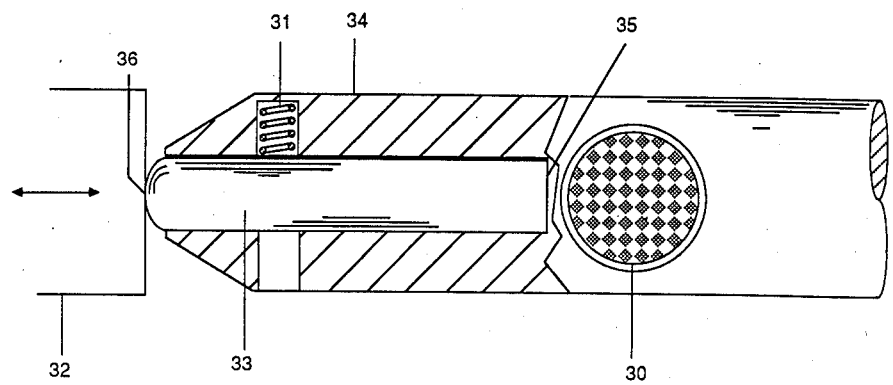
FIG. 3 is a section of the parts composing Form 3 of the device in which the support point of the specimen is connected to the specimen translation stage by a spring loaded rod made of a material having a low coefficient of thermal expansion.

Referring again to the drawings, FIG. 3 shows a third practical form of the device (Form 3) consisting of a single rod of silica 33 in the nose of a side entry electron microscope specimen holder 34. The specimen rod spans the distance between a stop 35 near the specimen 30 and a support point 36 on the specimen translation stage 32 (only part of which is shown in the drawing). Any transverse movement of the silica rod which would reduce the specimen image stability is prevented by the spring 31. The strength of this spring is chosen such that it allows the silica rod to slide freely along its axis, thereby preventing the movements caused by expansion and contraction of the specimen holder from being transmitted to the specimen. Since the silica rod is held in the specimen holder only by the spring it can be exchanged easily if it is cracked or chipped by rough handling.

It should not be construed that this invention is restricted to the choice of the specific materials described above. For example, an arrangement that works almost as well as the preferred arrangement of Form 1 is to use titanium or a titanium alloy for the specimen holder, aluminum or an aluminum alloy for the tube and titanium instead of silica for the rod. The introduction of other materials for the rod as a third expansion leg gives even more flexibility in the choice of lengths for the various parts of the assembly but the thermal response is slower and harder to match to the thermal response of the specimen holder.

It should not be construed that this invention is limited to the use of just one or two compensating elements to construct the device. Any number of elements may be used as long as the thermal expansion or contraction of the assembly negates that of the specimen holder. However, the increasing complexity and less predictable thermal response of the multi-element devices generally makes them less useful.

What is claimed is:

1. A device for inhibiting specimen drift in an electron microscope comprising a plurality of rigid members connected mechanically in series with their axes of thermal expansions aligned and each having particular lengths and expansion coefficients such that the change in length of the device for a given temperature change compensates the change in length for the same temperature change of an electron microscope specimen holder with which the device is in good thermal contact so that the temperature of said assembly closely follows the temperature of the specimen holder.

2. A device comprising a metal tube joined directly to an electron microscope specimen holder at one end, so that the temperature of said tube closely follows the temperature of the specimen holder, and resting against a specimen translation stage at the other end and having an axis of thermal expansion aligned with an axis of thermal expansion of said specimen holder and a particular length and expansion coefficient such that the change in length of said tube for a given temperature change compensates the change in length for the same temperature change of the specimen holder.

3. A device for inhibiting specimen drift in an electron microscope comprising a metal tube concentric with a rod, the tube being directly joined to said rod at one end and to an electron microscope specimen holder at the other so that the temperature of the assembly closely follows the temperature of the specimen holder, the other end of said rod resting against a specimen translation stage and said rod being free to slide inside the tube with axes of thermal expansion of said rod and said tube being aligned with an axis of thermal expansion of said specimen holder and the lengths and expansion coefficients of said tube and rod being selected such that the change in length of the device for a given temperature change compensates the change in length for the same temperature change of the specimen holder.

4. A device as claimed in claim 2 in which the metal tube is made of aluminum or an aluminum alloy and the specimen holder is made of copper.

5. A device as claimed in claim 3 in which the metal tube is made of aluminum or an aluminum alloy, the specimen holder is made of copper and the rod is made of vitreous silica.

6. A device as claimed in claim 3 in which the metal tube is made of aluminum or an aluminum alloy, the specimen holder is made of titanium or titanium alloy and the rod is made of titanium.

7. A device for reducing thermal drift in side entry electron microscope specimen holders consisting of a freely sliding rod of material having a small coefficient of thermal expansion inserted into the nose of the specimen holder and spanning as much as possible of the distance between the specimen and a specimen rod support point on a translation stage, and being clamped to the specimen holder by a spring which permits sliding along the rod axis while preventing movement perpendicular to it.

8. A device as claimed in claim 7 in which the low expansion rod is made of vitreous silica.

* * * * *